United States Patent
Wadhwa et al.

(10) Patent No.: US 7,099,204 B1
(45) Date of Patent: Aug. 29, 2006

(54) CURRENT SENSING CIRCUIT WITH A CURRENT-COMPENSATED DRAIN VOLTAGE REGULATION

(75) Inventors: Sameer Wadhwa, Santa Clara, CA (US); Bhimachar Venkatesh, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/087,944

(22) Filed: Mar. 23, 2005

(51) Int. Cl.
*G11C 7/00* (2006.01)

(52) U.S. Cl. .......................... 365/189.09; 365/285.02; 365/206

(58) Field of Classification Search .................. None
See application file for complete search history.

(56) References Cited

U.S. PATENT DOCUMENTS

| | | | |
|---|---|---|---|
| 5,519,656 A * | 5/1996 | Maccarrone et al. ... | 365/189.09 |
| 6,054,879 A | 4/2000 | Meng | |
| 6,462,982 B1 * | 10/2002 | Numata et al. .......... | 365/158 |
| 6,510,082 B1 | 1/2003 | Le et al. | |
| 6,529,412 B1 | 3/2003 | Chen et al. | |
| 6,791,880 B1 | 9/2004 | Kurihara et al. | |
| 6,819,591 B1 | 11/2004 | Kurihara et al. | |
| 6,847,568 B1 * | 1/2005 | Gogl et al. .................. | 365/205 |
| 6,856,555 B1 * | 2/2005 | Fujimoto ................ | 365/189.07 |
| 7,009,882 B1 * | 3/2006 | Chen ....................... | 365/185.18 |
| 2005/0219914 A1 * | 10/2005 | Sarin et al. ............ | 365/189.01 |

OTHER PUBLICATIONS

"Virtual-Ground Sensing Techniques for Fast, Low-Power, 1.8V Two-Bit-Per-Cell Flash Memories", Binh Quang Le, A Dissertation Submitted to the Department of Electrical Engineering and the Committee on graduate studies of Stanford University in partial fulfillment of the requirements for the degree of Doctor of Philosophy, Nov. 2003, 148 pgs.

\* cited by examiner

*Primary Examiner*—Tan T. Nguyen
(74) *Attorney, Agent, or Firm*—Eschweiler & Associates, LLC

(57) ABSTRACT

The present invention facilitates more accurate data reads by compensating for parasitic behavior—thus regulating the voltage at the drain of a core memory cell rather than at the output of a sensing circuit. More particularly, respective voltages at one or more nodes, such as the start of a bitline at a sensing circuit, for example, are adjusted to compensate for voltage drops that may occur due to parasitic behavior. Maintaining the substantially constant voltage levels at core memory cells allows comparisons to be made under ideal conditions while reducing the side leakages in virtual ground schemes. This mitigates margin loss and facilitates more reliable data sensing.

10 Claims, 6 Drawing Sheets

CURRENT SENSING CIRCUIT WITH A CURRENT-COMPENSATED DRAIN VOLTAGE REGULATION

FIELD OF INVENTION

The present invention relates generally to memory for electronic systems and the like, and in particular to managing parasitic losses and leakage currents that may develop when reading a memory cell.

BACKGROUND OF THE INVENTION

Many different types memory exist to store data for computers and the like. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to provide for data storage.

Each type of memory has its own particular advantages and disadvantages. For example, DRAM and SRAM allow individual bits of data to be erased one at a time, but such memory loses its data when power is removed. Alternatively, EEPROM can be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

As with other types of memory, flash memory is generally constructed of many memory cells that may store binary pieces of information referred to as bits. The respective memory cells are typically comprised of a semiconductor structure, such as a stacked gate metal oxide semiconductor (MOS) transistor device. The memory cells are generally organized into addressable units or groups, which are accessible for read, write and/or erase operations. The cells are, for example, commonly organized into bytes which comprise eight cells, and words which may include sixteen or more cells, usually configured in multiples of eight. The erase, write and/or read operations are commonly performed by application of appropriate voltages to certain terminals of the memory cells. In an erase or write operation, for example, the voltages are applied to cause charge to be removed or stored in a memory cell. In a read operation, on the other hand, appropriate voltages are applied so as to cause a current to flow in the cell, where the amount of current is a function of the amount of charge stored within the cell, among other things. The amount of charge stored within the cell corresponds to a state of the cell, and the state of the cell can be designated for data storage. For example, a certain amount of charge can correspond to a high data state which can be designated as a logic high or a binary data bit "1". Similarly, a lesser amount of stored charge can correspond to a low state which can be designated as a logic low or a binary data bit "0". A length of memory cells containing such respective binary bits can be strung together to store data, such as an 8 bit word, for example.

A relatively modern memory technology is dual sided ONO flash memory, which allows multiple bits to be stored in a single cell. In this technology, a memory cell is essentially split into two identical (dualed) parts, each of which is designed to store one of two independent bits. Each dual sided ONO flash memory cell, like a traditional cell, has a gate with a source and a drain. However, unlike a traditional stacked gate cell in which the source is always connected to an electrical source and the drain is always connected to an electrical drain, the source and drain of a dual sided ONO flash memory cells can be reversed depending upon which of the two bits/sides of the memory cell are operated upon.

As with arrays of other types of memory cells, dual sided ONO flash memory cells are fashioned by initially forming conductive bitlines within a semiconductor substrate. However, rather than merely forming an oxide layer over the bitlines in establishing the transistors that serve as the memory cells, a trilayer of oxide nitride oxide (ONO) materials is then formed over the bitlines and substrate in forming an array of ONO flash memory cells. This trilayer of material can be referred to as a "charge trapping dielectric layer", and generally includes a first insulating layer, a charge trapping layer, and a second insulating layer, where respective amounts of charge can be "trapped" within the charge trapping layer. Wordlines are then formed over the charge trapping dielectric layer substantially perpendicularly to the bitlines. Control over two bits per cell is governed by application of voltage signals to the wordline, which acts as a control gate, and changing bitline connections such that one bit is acted upon when the source and drain are connected in one arrangement and a complementary bit is acted upon when the source and drain are connected in another arrangement. A fixed ground line is generally not necessary in an array of ONO cells due to the differing bitline connections and resulting source and drain arrangements in the cells. As such, an array of ONO cells can be said to embody a "virtual ground" architecture.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto an individual semiconductor wafer (or die).

One technique to pack more memory cells/transistors into a smaller area is to form their structures and component elements closer together. Forming bitlines closer together, for example, shortens the length of a channel defined therebetween and allows more devices to be formed in the same area. This can, however, cause certain undesirable phenomena to become more prevalent. For example, isolating two bits or charges stored within a charge trapping layer becomes increasingly difficult as the channel length is decreased and the individual bits are brought closer together within the charge trapping layer. For example, the stored charges can contaminate or interfere with one another as they are brought closer together. This can, for example, cause a current developed in a memory cell during a read operation to seem inordinately high, which can lead to a mistaken interpretation of a logic high or "1" when, in fact, the read should have yielded a logic low or "0". The fact that stored charges or dual bits can impact one another is sometimes referred to complimentary bit disturb or CBD. Such "mis-reads" can also be exacerbated by parasitic effects that can be experienced when reading a memory cell, as well as by current leakage that may occur in a "virtual ground" type architecture. Accordingly, it would be desirable to be able to read a memory cell, including a dual bit memory cell, in a manner that accounts for these issues and thereby promotes a more accurate read.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention serve to maintain a relatively constant voltage at a drain of a memory cell by compensating for parasitic behavior that may occur within a bitline decoding path. A relatively constant voltage can similarly be maintained at a protection node adjacent to the memory cell by compensating for parasitic behavior in a preamplifier path. The voltage at the protection node is generally maintained at the same level as the drain voltage. This mitigates the development of side leakage currents between the memory cell and the adjacent protection node. Compensating for parasitics and maintaining substantially constant voltages at these nodes mitigates margin loss and facilitates more reliable data sensing.

According to one or more aspects of the present invention, a circuit is disclosed that is configured to maintain a substantially constant voltage at a drain of a memory cell. The voltage is maintained by compensating for parasitics within a bitline decoding path. The circuit includes a current compensating feedback component that facilitates adjustments to the drain voltage Vd by adjusting a DATAB voltage on the bitline decoding path as a function of a current Icore flowing through the bitline decoding path, where the current flowing through the bitline decoding path results in a voltage drop across the bitline parasitics which reduces the drain voltage. Adjusting the DATAB voltage compensates for the voltage drop across the bitline parasitics to thereby maintain the drain voltage Vd at a substantially constant level.

According to one or more other aspects of the present invention, a circuit is disclosed that is configured to maintain a substantially constant voltage at a protection node adjacent to a drain of a memory cell to mitigate leakage currents from arising between the drain and the protection node. The voltage is maintained by compensating for parasitics within a preamplifier path. The circuit includes a current compensating feedback component that facilitates adjustments to the protection node voltage Vp by adjusting a PRE voltage on the preamplifier path as a function of a current Ip flowing through the preamplifier path, where the current flowing through the preamplifier path results in a voltage drop across the preamplifier parasitics which reduces the protection node voltage. Adjusting the PRE voltage compensates for the voltage drop across the preamplifier parasitics to thereby maintain the protection node voltage Vp at a substantially constant level.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
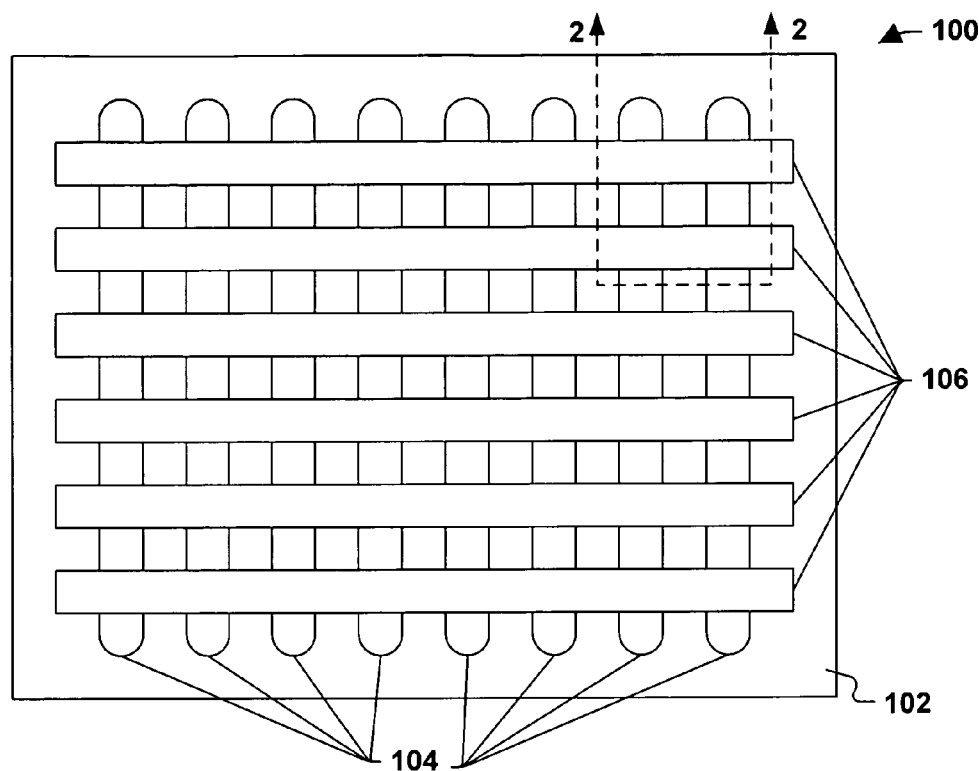
FIG. 1 is a top view of at least a portion of a memory array.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention promotes more accurate data reads by maintaining a substantially constant voltage at one or more desired nodes. By way of example, prior art FIG. 1 represents a top view of at least a portion of a memory array 100. The memory array 100 is formed upon a semiconductor substrate 102, such as a semiconductor wafer, or die of the wafer. The array 100 includes a plurality of bitlines 104 that are implanted into the substrate 102, and that extend substantially parallel to one another. The array 100 further includes a plurality of wordlines 106 formed over the implanted bitlines 104 and substrate 102. The wordlines 106, in the present example, are substantially parallel to one another and are substantially perpendicular to the implanted bitlines 104.

Figure 2:
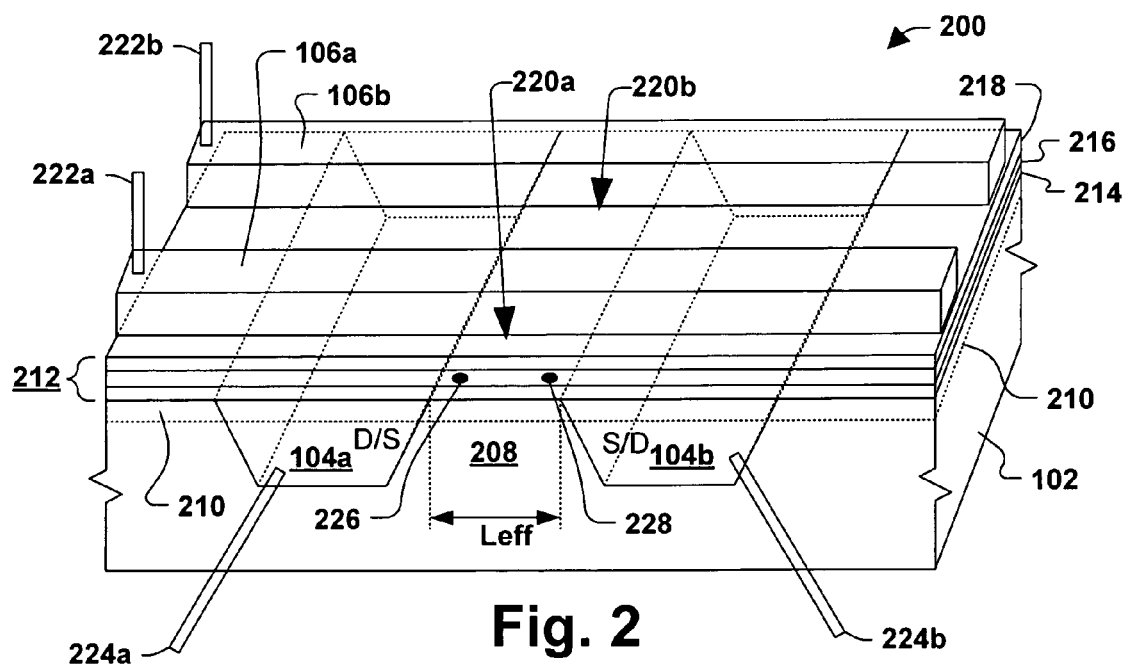
FIG. 2 is a cross-sectional isometric illustration of a portion of a memory array, such as that taken along line 2—2 of FIG. 1.

FIG. 2 is a cross-sectional isometric illustration of a portion 200 of a conventional memory array, such as that taken along line 2—2 of the array 100 in FIG. 1. It will be appreciated that, for purposes of discussion, a dual bit type of memory cell is depicted in the example illustrated in FIG. 2. However, it will also be appreciated that application of one or more aspects of the present invention is not limited to dual bit memory cells, nor to memory cells generally.

In the illustrated example, first and second conductive bitlines 104a and 104b are formed within a semiconductor substrate 102. It will be appreciated that any number of such bitlines can be implanted into the semiconductor substrate 102, and that such bitlines may correspond to the bitlines 104 depicted in FIG. 1. The bitlines are typically formed of an implanted n-type material, such as arsenic, for example. The first and second conductive bitlines 104a and 104b are spaced apart by an effective length (Leff) and a channel region 208 is defined between the bitlines 104a, 104b.

The substrate 102 in the illustrated example is doped with a p-type impurity such as boron, for example, to establish a threshold adjustment implant (Vtadjust) region 210 therein. The threshold adjustment implant provides a region 210 that is more heavily doped than the semiconductor substrate 102. The Vtadjust region 210 helps to set a threshold voltage Vt of the transistor devices at which a current can be conducted in a transistor based memory cell defined within/upon the substrate 102. By way of example, the substrate 102 can be formed out of silicon and can itself be doped with a p-type impurity.

A charge trapping dielectric layer 212 is formed over the semiconductor substrate 102 and implanted bitlines 104a, 104b. The charge trapping dielectric layer 212 is generally composed of three separate layers: a first insulating layer 214, a charge trapping layer 216, and a second insulating layer 218. The first and second insulating layers 214 and 218 are typically formed of an oxide dielectric such as silicon dioxide ($SiO_2$) and the charge trapping layer 216 is generally formed of a nitride dielectric such as silicon nitride ($Si_xN_y$). The oxide-nitride-oxide configuration is commonly referred to as an ONO layer for convenience.

Electrically conductive wordlines 106a, 106b overlie the charge trapping dielectric layer 212. It will be appreciated that any number of such wordlines can be formed over the charge trapping dielectric layer 212, and that such wordlines may correspond to the wordlines 106 depicted in FIG. 1. The wordlines can be formed out of a polysilicon material, for example, where the polysilicon material may be deposited over the charge trapping dielectric layer 212 and then patterned and etched into the shape of the wordlines.

It will be appreciated that a transistor that serves as a memory cell 220a is thus defined by a portion of the bitline 106a that overlies the channel region 208, a portion of the charge trapping dielectric layer 212 that similarly overlies the channel region 208, the portion of the substrate 102 making up the channel region 208 and respective portions of the bitlines 104a, 104b that are adjacent to the channel region 208. It will also be appreciated that another transistor based memory cell 220b would be similarly established behind cell 220a, and that other similar cells would be defined to the left and to the right of cells 220a and 220b to make up an array of such cells. Although not shown, it can be appreciated that adjacent cells share bitlines in this architecture.

As in all such transistor based memory cells, the wordline 106a serves as a gate for cell 220a, and allows a gate voltage to be applied to the gate of the cell 220a, such as by way of an electrical contact 222a operatively coupled to the wordline 106a. Similarly, a gate voltage can be applied to the gate of cell 220b by way of an electrical contact 222b operatively coupled to wordline 106b. It will be appreciated that since wordlines are continuous, a gate voltage is generally applied concurrently to respective gates of memory cells that are in the same row, such as respective cells (not shown) that would be to the left and to the right of cells 220a and 220b, for example.

Portions of the bitlines 104a, 104b adjacent to the channel region 208 serve as source and drain regions of the transistor based memory cell 220a. As with the wordlines, a voltage can be applied to these regions by way of electrical contacts 224a and 224b, for example. Additionally, since the bitlines 104a, 104b are continuous, a bias applied thereto generally reaches all of the memory cells on the same bitlines (notwithstanding losses due to resistance, etc.). Since, in the illustrated example, a dual bit memory cell is depicted, either of the bitlines can serve as the source (S) or the drain (D) of the transistor 220a depending upon which side of the transistor is being operated upon, hence the aforementioned virtual ground architecture. Locations 226 and 228 generally indicate where respective amounts of charge can be stored in the charge trapping layer 216 of the memory cell 220a to represent respective states of two separate bits of data.

It will be appreciated, however, that the different charges stored in the charge trapping layer 216 will be brought closer together as scaling occurs and the channel length shrinks, for example. This may give rise to complimentary bit disturb (CBD), the effects of which may be particularly noticeable when reading data from the memory cell. For example, to read data from the cell 220a a gate voltage is applied to the gate of the cell, such as via contact 222a, while a supply voltage ($V_{cc}$) is concurrently applied to one of the two bitlines 104a or 104b, such as via contact 224a or 224b. The particular bitline 104a or 104b that receives the supply voltage depends upon which of the bitlines is serving as the drain of the cell 220a, which is, in turn, a function of which side of the cell is being read. The application of these voltages causes a current to flow within the cell, generally through the channel 208—from the drain to the source, where the magnitude of the current is a function of the amount of charge stored in the side of the cell 220a being read. With CBD, however, the current read out of the cell may appear larger or smaller than it would normally be in the absence of the neighboring charge. Accordingly, the current read out may mistakenly be interpreted to correspond to a data bit of "1" instead of "0" and vice versa. Thus, it would be desirable to be able to increase the resolution of current read out from a transistor based memory cell so that a more accurate determination of cell state/bit level can be made. As will be discussed further, increasing the bitline voltage level during the read operation is one technique for mitigating CBD and facilitating more accurate reads.

Additionally, to meet the ever growing demand for greater storage capacity in increasingly smaller electronic devices, dual bit memory cells, such as cell 220a are being engineered to store multiple levels of charge on both sides of the charge trapping layer 216. This is possible because the charge trapping layer 216 is substantially non-conductive and, thus, a charge instilled therein (e.g., via application of an appropriate wordline voltage) remains substantially localized at positions 226 and 228. This allows the memory cell 220a, and correspondingly an array of such cells, to store an increased amount of data. For example, if four different levels of charge (e.g., 1, 2, 3 and 4) can be stored on both sides of the cell 220a at locations 226 and 228, then the cell 220a can represent 16 different combinations of bit states (e.g., 1-1, 1-2, 1-3, 1-4, 2-1, 2-2, 2-3, 2-4, 3-1, 3-2, 3-3, 3-4, 4-1, 4-2, 4-3 and 4-4). It can be appreciated, however, that this reduces read margins for reading the different bit levels and exacerbates the difficulty in correctly identifying the different bit states.

Figure 3:
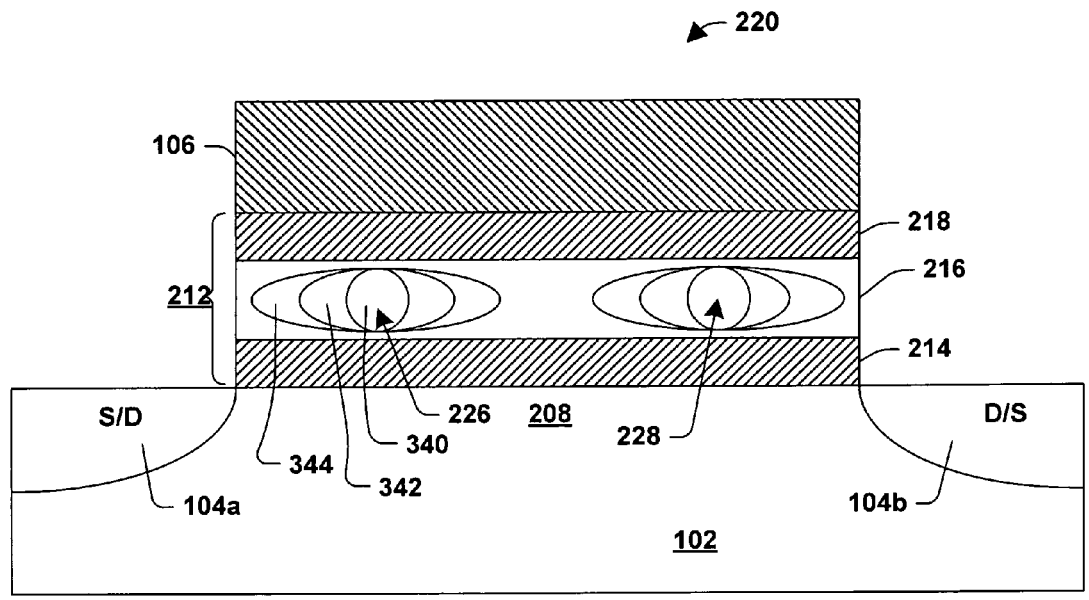
FIG. 3 is a cross sectional illustration of a dual bit memory cell.

FIG. 3 is a cross sectional illustration of a dual sided ONO flash memory cell 220 illustrating the capability of the cell to store varying degrees of charge at locations 226, 228. It will be appreciated that the memory cell 220 may, for example, correspond to the memory cell 220a depicted in FIG. 2. The cell 220 includes a charge trapping dielectric layer 212 that comprises a charge trapping layer 216 sandwiched between two dielectric layers 214, 218. The charge trapping layer 216 is formed from one or more substantially non-conductive substances, such as nitride based materials. The dielectric layers 214, 218 are similarly formed from one or more electrically insulating substances, such as oxide based materials. The layer to layer arrangement of the charge trapping dielectric layer 212 is commonly referred to as an ONO layer.

The charge trapping layer dielectric layer 212 is formed over a substrate 102 that may be formed from silicon or some other semiconductor material, for example. The substrate 102 may be selectively doped with a p-type dopant, such as boron, for example, to alter its electrical properties. In the example illustrated, the substrate 102 has buried bitlines or bitline diffusions including a first bitline 104a and a second bitline 104b. The bitlines 104a and 104b may, for example, be formed by an implanted n-type dopant. A channel 208 is defined within the substrate between the first 104a and second 104b bitline diffusions.

Overlying the upper dielectric layer 218 of the charge trapping dielectric layer 212 is a gate 106 (e.g., a portion of a wordline). This gate 106 may be formed from a polysilicon material, for example, and may be doped with an n-type impurity (e.g., phosphorus) to alter its electrical behavior. The gate 106 serves as a means for allowing a voltage to be applied to the cell 220 such that respective charges can be stored within and read out and erased from the cell at locations 226, 228, depending upon the electrical connections of the bitline diffusions 104a, 104b as source and drain.

The dual sided ONO flash memory cell 220 is generally symmetrical, thus the bitlines 104a and 104b are interchangeable as acting source and drain. The cell 220 can be programmed by applying a voltage across the gate 106 and an acting drain region and connecting an acting source region to ground. It can be appreciated that if the voltages utilized to program the left 226 and right 228 bit locations of the cell 220 are increased or sustained for longer periods of time, the number of electrons or amount of charge stored at these locations can be increased or otherwise varied. This allows the cell 220 to be utilized for additional data storage. For example, different amounts of charge can correspond to different programmed states. In the example illustrated, for instance, both the left 226 and right 228 bit locations can be said to have four different states or levels, namely 1, 2, 3 and 4, where level 1 corresponds to a situation where the locations are blank or un-programmed, and levels 2, 3 and 4 correspond to increasing amounts of stored charge, respectively. With regard to the left bit location 226, for example, a level 2 may correspond to a relatively small amount of stored charge 340, while levels 3 and 4 may correspond to increasingly larger amounts of stored charge 342 and 344, respectively.

It can be appreciated that the quantity of charge stored in the respective locations 226 and 228 influences the amount of current that flows between the acting source and the acting drain during a read operation, as well as the level of a threshold voltage (Vt) that must be applied to the gate 106 in order to cause such current to flow. Thus, the level of stored bits can be determined by examining drain to source currents (sometimes referred to as the core current Icore) as well as corresponding applied threshold gate (wordline) voltages. For example, measured currents and/or threshold voltages that fall within first, second, third or fourth ranges may, for example, be indicative of a level 1, level 2, level 3 or level 4, respectively for a particular bit.

It can be further appreciated, however, that even though the charge trapping layer 216 is substantially non-conductive and electrons trapped therein remain substantially localized within regions 226 or 228, the effects of complimentary bit disturb can manifest to a greater degree where dual bits can be programmed to different levels, such as 340, 342 and 344. For example, if left bit location 226 is un-programmed (level 1) or is only slightly programmed (level 2) and right bit location 228 is highly programmed (level 4), then some of the charge utilized to program the right bit may influence the left bit, and cause current flowing in the cell during a left bit read to be higher than intended, for example. This can similarly cause the threshold voltage necessary to read the left bit to be inflated such that its Vt is more indicative of a level 3 rather than the actual level 1 or level 2 of the left bit. Similarly, the (lack of) charge on the left bit may cause the right bit to read a lower current than intended, or rather cause the threshold voltage necessary to read the right bit to be deflated such that this Vt is more indicative of a lower bit level.

Figure 4:
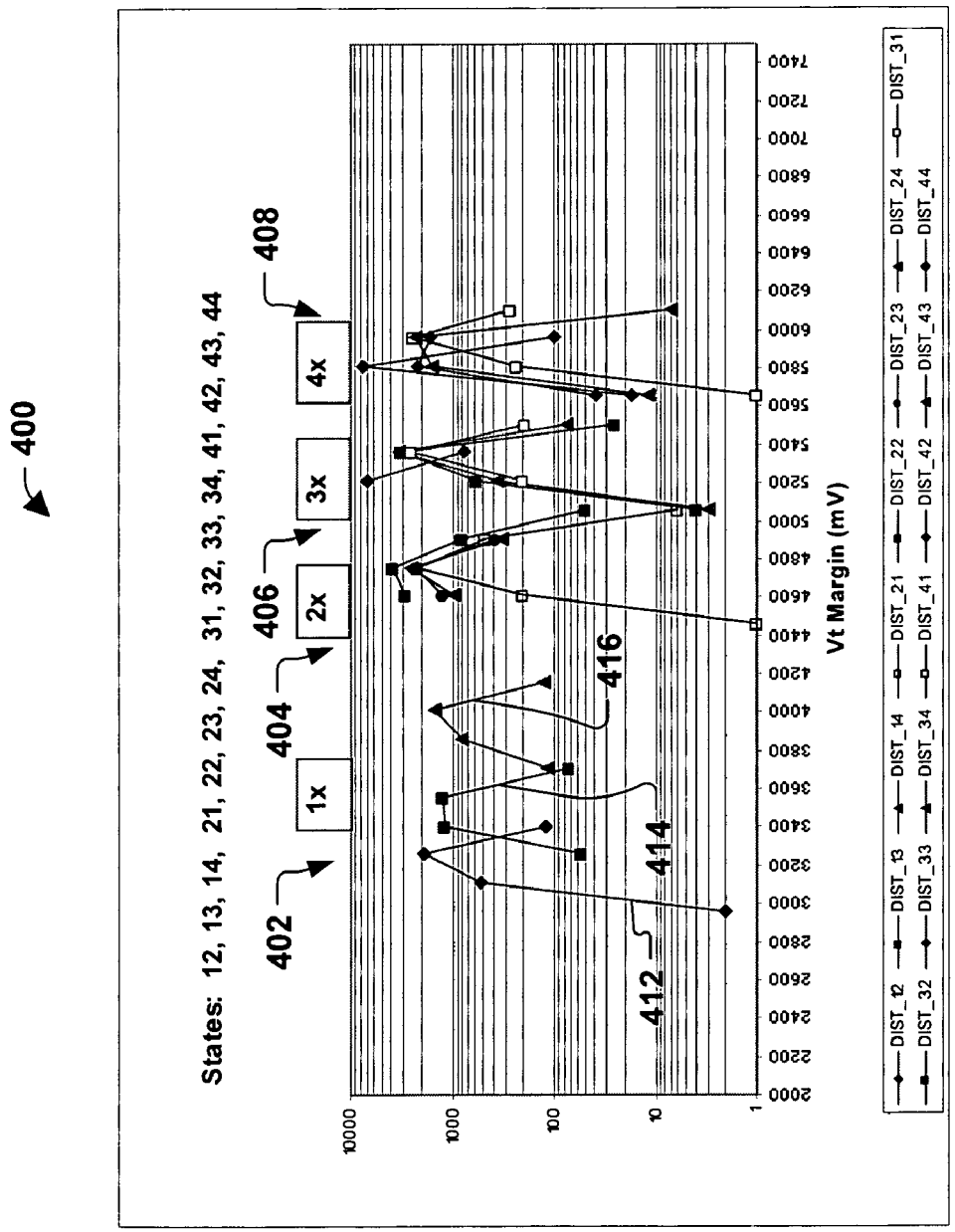
FIG. 4 is a graph illustrating a situation where dual bits can be programmed to four different levels.

FIG. 4 is a graph 400 that illustrates such a situation where dual bits within a cell can be programmed to four different levels, and where the charges on the cells can affect one another. A threshold read voltage (Vt) margin for one of the bits as measured in milli-volts (mV) is plotted on the x-axis, while the distribution or number of occurrences for particular Vt's is plotted on the y-axis on a logarithmic scale. The graph 400 includes four different exemplary groupings of curves 402, 404, 406, 408 corresponding to the four different levels the bit can possess. Each of the groupings contains a plurality of curves that reveal the shift in read Vt for the measured bit as the level of the neighboring or complimentary bit is altered (e.g., increased).

For example, grouping 402 includes three curves 412, 414, 416 that correspond to states of 1-2, 1-3 and 1-4, respectively. It can be seen that as the neighboring bit is programmed harder, a range of values of Vt for the read bit (which remains at a level 1 in all of the curves 412, 414, 416 in grouping 402) increases. In curve 412, for example, where the complimentary bit is programmed to a level 2, the value of Vt for the read bit falls within a range of between about 3000 to about 3500 millivolts. In curve 416, however, where the complimentary bit is programmed to level 4, the range of Vt values for the read bit is shifted upwards to between about 3700 to about 4200 millivolts. It can be appreciated that, while not as dramatic, similar shifts occur where the read bit is programmed to levels 2, 3, and 4 and the neighboring bit is cycled through programmed levels 1, 2, 3, and 4. This can be seen in groupings 404, 406 and 408, respectively.

Figure 5:
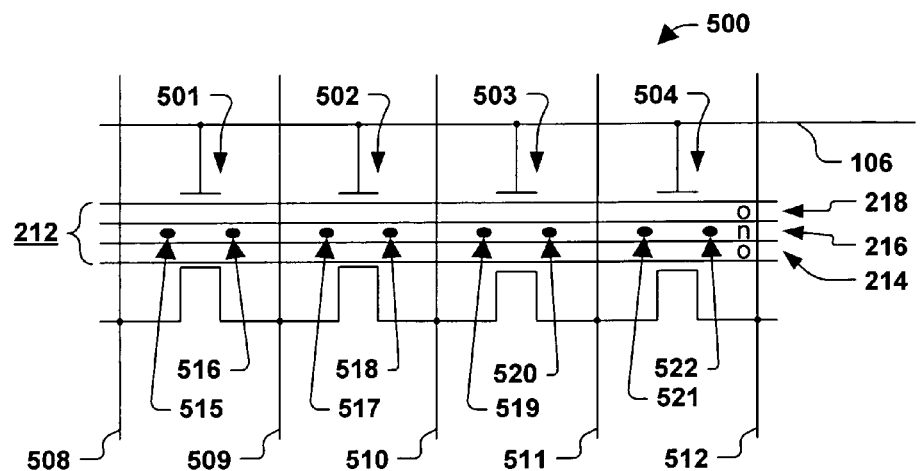
FIG. 5 is a schematic illustration of a portion of a memory core, such as may include at least part of the array depicted in FIG. 1.

FIG. 5 schematically illustrates a portion 500 of a memory core such as may include at least part of the array 100 depicted in FIG. 1. The circuit schematic shows a line or row of memory cells, which includes memory cells 501 through 504, any one of which may correspond to memory cell 220 depicted in FIG. 3 and/or 220a of FIG. 2, for example. The respective memory cells 501 through 504 are connected in a virtual ground type implementation such that pairs of the memory cells share a common bitline. For instance, in the example shown, the memory cell 501 has associated bitlines 508 and 509; the memory cell 502 has associated bitlines 509 and 510; the memory cell 503 has associated bitlines 510 and 511; and the memory cell 504 has associated bitlines 511 and 512. As such, cells 501 and 502 share bitline 509, cells 502 and 503 share bitline 510 and cells 503 and 504 share bitline 511, respectively. Additionally, the memory cells are coupled to a common wordline 106, which serves as a control gate for the cells.

The memory cells in the illustrated example are dual bit cells such that, depending upon wordline voltages and bitline connections, the memory cells 501 through 504 are capable of writing, reading, and erasing bits at locations 515 through 522. Storage of multiple bits is made possible, at least in part, by a charge trapping dielectric layer 212 interposed between the bitlines and the wordline. The charge trapping dielectric layer 212 includes multiple insulating layers 214, 218 (e.g., of oxide based material) that sandwich a charge trapping layer 216 (e.g., of nitride based material). To perform a read operation at location 515, for example, the source is designated so as to be connected to bitline 508 and the drain is designated so as to be connected to bitline 509, and a supply voltage is applied to bitline 508 and a gate voltage is applied to the wordline 106. During a programming operation at location 515, for example, the source and drain are reversed such that the source is designated so as to be connected to bitline 509 while the drain is designated so as to be connected to bitline 508. By way of further example, to read at location 516 the drain is connected to bitline 508 and the source is connected to bitline 509.

The charge trapping or ONO layer 216 allows the different bits to be stored at multiple states or levels as well. For example, depending upon the voltage applied to the memory cells 501 through 504 by the control gate or wordline 106 during programming, varying amounts of charge can be stored at locations 515 through 522. The different amounts of charge may correspond to different bit states or levels, for example. If four different charge levels (e.g., 1, 5, 3 and 4) can be stored at each of the bit locations 515 through 522, for example, then each two-bit cell 501 through 504 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

One or more aspects of the present invention facilitate a more accurate determination of bit levels by compensating for parasitics or parasitic behavior present in a bitline decoding path. This allows a voltage at the drain of a core memory cell to be maintained at a relatively constant level regardless of changes in current flowing through the bitline decoding path, where such changes in current would otherwise cause the voltage at the drain of the core memory cell to fluctuate since this drain voltage is affected by a voltage drop across the parasitics in the bitline path, and the drop across these parasitics changes when the current in the bitline decoding path changes. Maintaining this drain voltage at a relatively constant level is important because fluctuations in this voltage can interfere with reading data from the core memory cell since this drain voltage may not "match up" with a drain voltage of a reference memory cell against which the core cell is compared. This would, for example, result in a comparison of "un-like" cells (e.g., comparing "apples to oranges") since the core memory cell and the reference memory cell would not be operated or read under the same conditions, which may lead to an inaccurate data read.

Additionally, since virtual ground architectures are employed in dual bit memories such that the core memory cells are connected together in a chain, a large (generally sideways) leakage current can occur as a drain voltage is increased (e.g., to read a cell), since surrounding nodes are merely floating at a lower voltage level. To mitigate this leakage, one or more adjacent "protection (P)" nodes can be charged by a preamplifier to the same voltage level as the drain of the core cell being read. In so doing, there is no bias or voltage difference between the drain and the P node so that no current flows or "leaks" there-between. It can thus be appreciated that it is important to maintain the voltage at the P node very close to the drain voltage to mitigate a side leakage current between the drain and the P node (e.g., from a larger potential to a smaller potential). A leakage current would introduce an error into the current that is being read, where too little current is read if some current leaks from the drain to the P node or too much current is read if some current leaks from the P node to the drain. As with the core cell, the voltage at the P node can fluctuate due to parasitics in a bitline decoding path. Accordingly, as with the voltage at the drain of a core memory cell, one or more aspects of the present invention similarly compensate for parasitics within a bitline decoding path to maintain a substantially constant voltage at a "protection" node, which in turn serves to mitigate side leakage currents. Additionally, conventional designs, such as that disclosed in "Virtual-Ground Sensing Techniques for Fast, Low-Power, 1.8V Two-Bit-Per-Cell Flash Memories", BINH QUANG LE, A Dissertation Submitted to the Department of Electrical Engineering and the Committee on graduate studies of Stanford University in partial fulfillment of the requirements for the degree of Doctor of Philosophy", November, 2003, 148 pgs. (the entirety of which is hereby incorporated by reference) have attempted to mitigate this side-leakage by charging up multiple (e.g., three drain and three protection) nodes on neighboring bitlines. The design proposed herein merely requires one 'D' and 'P' node to be charged up—thus increasing the sensing speed and reducing power consumption significantly.

Figure 6:
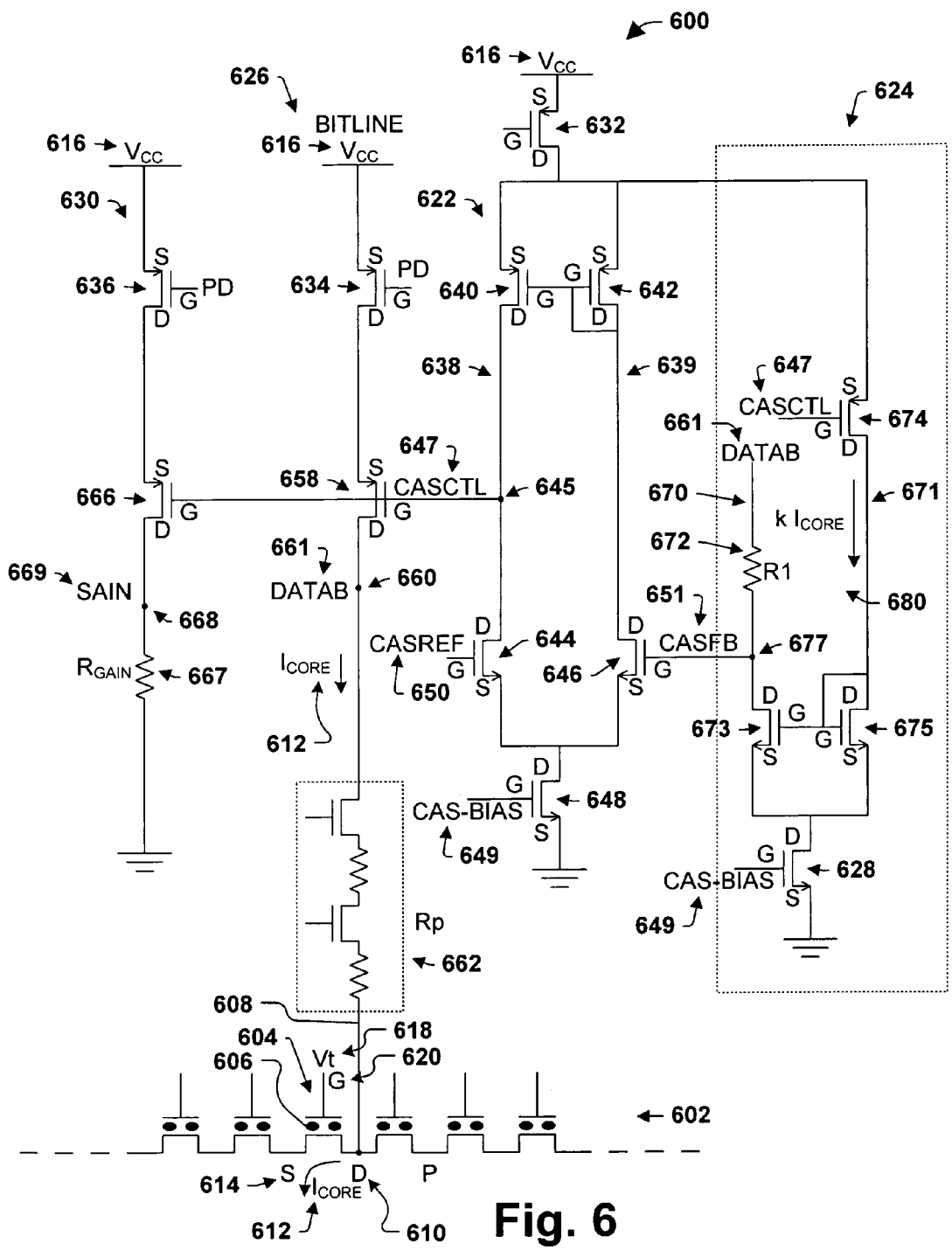
FIG. 6 is a schematic diagram illustrating an exemplary circuit according to one or more aspects of the present invention that facilitates compensating for parasitics.

FIG. 6 is a schematic diagram illustrating an exemplary circuit arrangement 600 according to one or more aspects of the present invention that facilitates compensating for bitline parasitics. More particularly, losses that occur across the bitline parasitics are compensated for so that a drain voltage can be maintained at a relatively constant level, which in turn facilitates a more accurate determination of bit levels. While not intending to be limited to the example presented, the circuit 600 is described in the context of sensing current in a transistor based memory cell, such as a dual bit flash memory cell. Accordingly, the circuit 600 is operatively connected to a row or chain 602 of such dual bit memory cells. In the illustrated example, the circuit 600 is operatively connected to a particular cell 604 within the row 602 so as to be able to determine the current flowing through the cell 604 when particular voltages are applied to the cell 604. For purposes of discussion, the left side of the dual bit cell 604 is being read (e.g., from location 606) in the illustrated example such that a bitline 608 coupled to the cell 604 corresponds to an acting drain 610 of the cell 604. Accordingly, a current (Icore) 612 that flows through the cell 604 when adequate voltages are applied to the cell flows from the drain 610 to the source 614 of the cell 604 when a regulated voltage 616 is applied to the bitline 608 and a sufficient gate voltage Vg 618 is applied to the gate 620 of the cell 604 (e.g., via a wordline that functions as a gate for respective cells in the row 602).

The circuit includes a differential amplifier component 622 and a current compensating feedback component 624, both of which are operatively coupled to a bitline path 626. The current compensating feedback component 624 further includes a feedback clamping device 628. The differential amplifier component 622, bitline 626 and an output stage 630 are operatively coupled to supply voltage Vcc 616. Similarly, differential amplifier component 622, bitline 626 and output stage 630 include, in the present example, respective power down (PD) p type or PMOS transistors 632, 634, 636 operatively coupled to the supply voltage 616, with the respective sources (S) of the PD's toward the supply voltage 616. It will be appreciated that when a PD signal is high, the respective transistors 632, 634, 636 are off, rendering the circuit 600 deactivated. It will also be appreciated that very little voltage drop is seen across the PD devices 632, 634, 636 (e.g., on the order of between about 1 to about 5 millivolts). As such, the power down devices 632, 634, 636 are merely regarded as passing Vcc 616 onto the respective nodes below them.

The differential amplifier component 622 includes left and right branches 638, 639 that have respective first 640 and second 642 upper transistors in parallel with one another, and first 644 and second 646 lower transistors also in parallel with one another, and in series with the upper transistors. In the illustrated example, the first 640 and second 642 upper transistors are p type or PMOS transistors, while the first 644 and second 646 lower transistors are n type or NMOS transistors. The differential amplifier 622 is configured such that the drain (D) of the first upper transistor 640 is operatively coupled to the drain (D) of the first lower transistor 644. Similarly, the drain (D) of the second upper transistor 642 is operatively coupled to the drain (D) of the second lower transistor 646. Additionally, the respective drains of the first upper and first lower transistors 640, 644 are coupled to a node 645 corresponding to a control signal (CASCTL) 647. Further, the drain of the second upper transistor 642 is coupled to the gate of that transistor 642. The sources (S) of lower transistors 644 and 646 are connected to the drain of an NMOS transistor 648, the source of which is coupled to ground, and the gate (G) of which is coupled to a bias signal (CAS-BIAS) 649. The respective sources (S) of upper transistors 640, 642 are operatively coupled to the drain (D) of power down (PD) transistor 632. The gates of upper transistors 640, 642 are connected to on another (and thus the drain (D) of second upper transistor 642 also), while the gates (G) of lower transistors 644, 646 are connected to voltage levels CAS-REF 650 and CASFB 651, respectively.

The drain of power down transistor 634 in bitline 608 is coupled to the source (S) of a bitline PMOS transistor 658 in the bitline path 626. The gate (G) of the bitline PMOS transistor 658 is coupled to node 645 and thus control signal CASCTL 647. The drain (D) of the bitline path PMOS 658 is coupled to a node 660, where a voltage level of DATAB 661 is present at that node 660. The drain (D) of bitline path PMOS 658 further connects down to the acting drain (D) 610 of the memory cell 604. Miscellaneous elements 662 (e.g., resistors, transistors, etc.) are illustrated in the bitline path 626 between the node 660 and the drain (D) 610 of the memory cell 604 to represent parasitic behavior that occurs within the bitline decoding path 626. It will be appreciated that bitline parasitics yield an associated resistance (Rp) that produces a voltage drop along the bitline path 626 as a function of the current Icore 612 flowing through the bitline path. Given the voltage drop across Rp, the voltage (Vd) at the acting drain (D) 610 of the core memory cell 604 is equal to the voltage at DATAB 661 minus the resistance of the bitline parasitics Rp times Icore 612. This reduced drain voltage can lead to inaccurate data reads where the drain voltage (Vd) is anticipated to be substantially equal to DATAB 661, such as where a comparison is made to a reference cell having DATAB applied to its drain, for example.

The drain (D) of power down transistor 636 of output stage 630 is coupled to the source (S) of a p type or PMOS transistor 666, with the drain (D) of transistor 666 coupled to one end of a gain resistor Rgain 667, the other end of which is connected to ground. The gate (G) of transistor 666 is coupled to the gate (G) of the bitline PMOS transistor 658 and thus control signal CASCTL 647. By way of example, Rgain 667 can have a value of between about 15000 to about 30000 ohms. The output of the circuit 600 can be tapped off of at node 668 situated between the drain (D) of transistor 666 and the first end of the gain resistor 667. The output of the circuit is a function of the current Icore 612 flowing in the bitline 608 and through the memory cell 604. This core current 612 is itself a function of the amount of charge stored in the memory cell 604, and more particularly in the left half of the cell—in the illustrated example—at location 606, as well as the respective voltages Vd and Vg at the drain (D) 610 and gate (G) 620 of the cell 600 during a read operation. The output of the circuit 600 can be used as an input (SAIN) 669 to a sense amplifier (not shown) which can utilize the same in making a determination as to the level of the charge stored at location 606.

The current compensating feedback component 624 comprises left and right branches 670, 671, with the left branch including an upper resistor R1 672 and a lower NMOS transistor 673 and the right branch including an upper PMOS transistor 674 and a lower NMOS transistor 675. The source (S) of the upper PMOS transistor 674 is operatively coupled to the drain (D) of power down transistor 632. The drain (D) of upper PMOS transistor 674 is coupled to the drain (D) of lower NMOS transistor 675. Respective sources (S) of lower NMOS transistors 673, 675 are operatively coupled to the drain (D) of an NMOS transistor 628 that serves as a feedback clamping device. The source (S) of NMOS transistor 628 is coupled to ground, while the gate (G) of transistor 628 is coupled to bias signal (CAS-BIAS) 649. The gate of NMOS transistor 675 is coupled back to the drain (D) of that transistor 675, as well as to the gate of NMOS transistor 673. The drain (D) of lower transistor 673 is coupled to a first end of resistor R1 672 through a node 677 that is coupled to the gate (G) of the transistor 646 and thus voltage level CASFB 651. The second end of resistor R1 672 is coupled to voltage level DATAB 661. Similarly, the gate (G) of upper PMOS transistor 674 is coupled to control signal voltage level CASCTL 647.

With regard to the operation of the circuit 600, the current compensating feedback component 624 serves to adjust the voltage Vd at the acting drain 610 in response to changes in current Icore 612 in the bitline decoding path 626 which affects the drop across the bitline parasitics 662 (e.g., due to Rp), and thus the drain voltage Vd. As such, the drain voltage Vd can be maintained at a desired level regardless of changes in bitline current Icore 612 so that this voltage "matches up" with a drain voltage of a reference cell. In this manner, the core and reference memory cells can be compared to one another under ideal voltage conditions to mitigate read error and margin loss.

More particularly, since the control signal CASCTL 647 that is applied to the gate (G) of the bitline transistor 658 is also applied to the gate (G) of the upper transistor 674 in the current compensating feedback component 624, the same current flows through these devices 658 and 674 (provided that the devices are sized the same). These same bias conditions also allow the devices to be sized to get a desired ratio, such as 1 to 2, 1 to 4, etc. As such, the right branch 671 of the current compensating feedback network 624 has a current 680 that is a ratio of the current in the bitline path, or k Icore, where k indicates the ratio.

The bottom transistor 675 in the right branch 671 of the current compensating feedback component 624 forms a current mirror with the bottom transistor 673 in the left branch 670. As such, the current 680 in the right branch 671 is mirrored across to the left branch 670, and thus through resistor 672. Since the current that flows through R1 672 is a ratio of the current flowing through the bitline path, or k Icore, the voltage seen at node 677 is equal to the DATAB voltage 661 coupled to the second end of resistor 672 minus the voltage dropped across R1, where this voltage drop is equal to R1 times k Icore. Accordingly, as the current Icore 612 flowing through the bitline path 626 increases, the current that flows through R1 also increases, increasing the voltage drop across R1, which reduces the voltage at node 677. The reduced voltage at node 677 is reflected back to transistor 646 in the differential amplifier component 622. As a result, the differential amplifier component 622 will cause the CASCTL voltage 647 at node 645 to decrease in an attempt to maintain a balance in its left and right branches 638, 639. Reducing CASCTL 647 will cause the PMOS device 658 in the bitline path 626 to turn on more since CASCTL 647 is applied to its gate (G), and the gate to source bias on that device 658 thus increases. This makes the PMOS device 658 act as more of a short, thereby reducing the voltage drop across it, and allowing DATAB 661 at node 660 to be pulled up closer to Vcc by a greater exposure to Vcc 616. The compensating component 624 and the differential amplifier component 622 thus increase the DATAB voltage 661 at node 660 when Icore 612 increases, which compensates for the drop across the bitline parasitics and allows the voltage Vd at the acting drain 610 to be held substantially constant.

The feedback clamping device 628 mitigates positive feedback that can develop from the current compensating feedback component 624, where increasing the DATAB voltage 661 at node 660 can itself result in an increased current Icore 612 in the bitline decoding path 626. The feedback clamping device 628 limits the extent of positive feedback so that the amount of compensation can be controlled. More particularly, the bias voltage CAS-BIAS 649 (typically generated from a bias generating circuit) applied to the gate (G) of the feedback clamping device 628 sets the maximum current that can flow through the device 628, which in turn limits the amount of current that can flow through the left and right branches 670, 671 of the current compensating feedback component 624. Limiting the amount of current that can go through the left branch 670 regulates how low CASFB 651 at node 677 can go because the CASFB voltage 651 at node 677 is equal to the voltage level of DATAB 661 at the second end of resistor 672 minus the current 680 in the left branch times R1. Defining a lower limit for CASFB 651 limits how low CASCTL 647 can go and thus how much DATAB 661 in the bitline path 626 can be brought up or increased during active compensation. It will be appreciated that while the discussion herein has involved increasing DATAB 661 and thus the voltage Vd at the acting drain 610, that DATAB 661 and thus the drain voltage Vd could similarly be decreased in accordance with one or more aspects of the present invention.

It will be appreciated that the drain voltage Vd is generally regulated to be as close to CASREF 650 as possible (e.g., since a drain voltage of a reference cell is also generally maintained at CASREF). By way of example, the potential necessary to compensate for the drop across the bitline parasitics can be designated as Vcomp. When no current is flowing through the bitline, Vcomp is 0 and node 660 (as well as the core cell drain (node 610)) are regulated to CASREF. When a positive current is drawn by the core cell, however, DATAB 661 at node 660 is shifted up by Vcomp such that the core drain (node 610) is still regulated to CASREF. The ratio Vcomp/Icore can be defined as the compensation impedance of the circuit. Preferably, the compensation impedance equals the bitline parasitics seen at the DATAB node 660. It will be appreciated that the current mirroring factor k, and the value of resistor value R1 are chosen to set the desired compensation impedance. Further, by governing the feedback of the circuit, the feedback clamping device 628 effectively sets the ceiling value for Vcomp. It will also be appreciated that one or more aspects of the present invention have application beyond that of flash memory and/or virtual ground architectures. It could be used in any current sensing application that needs a regulated sensing node (DATAB in this example).

Figure 7:
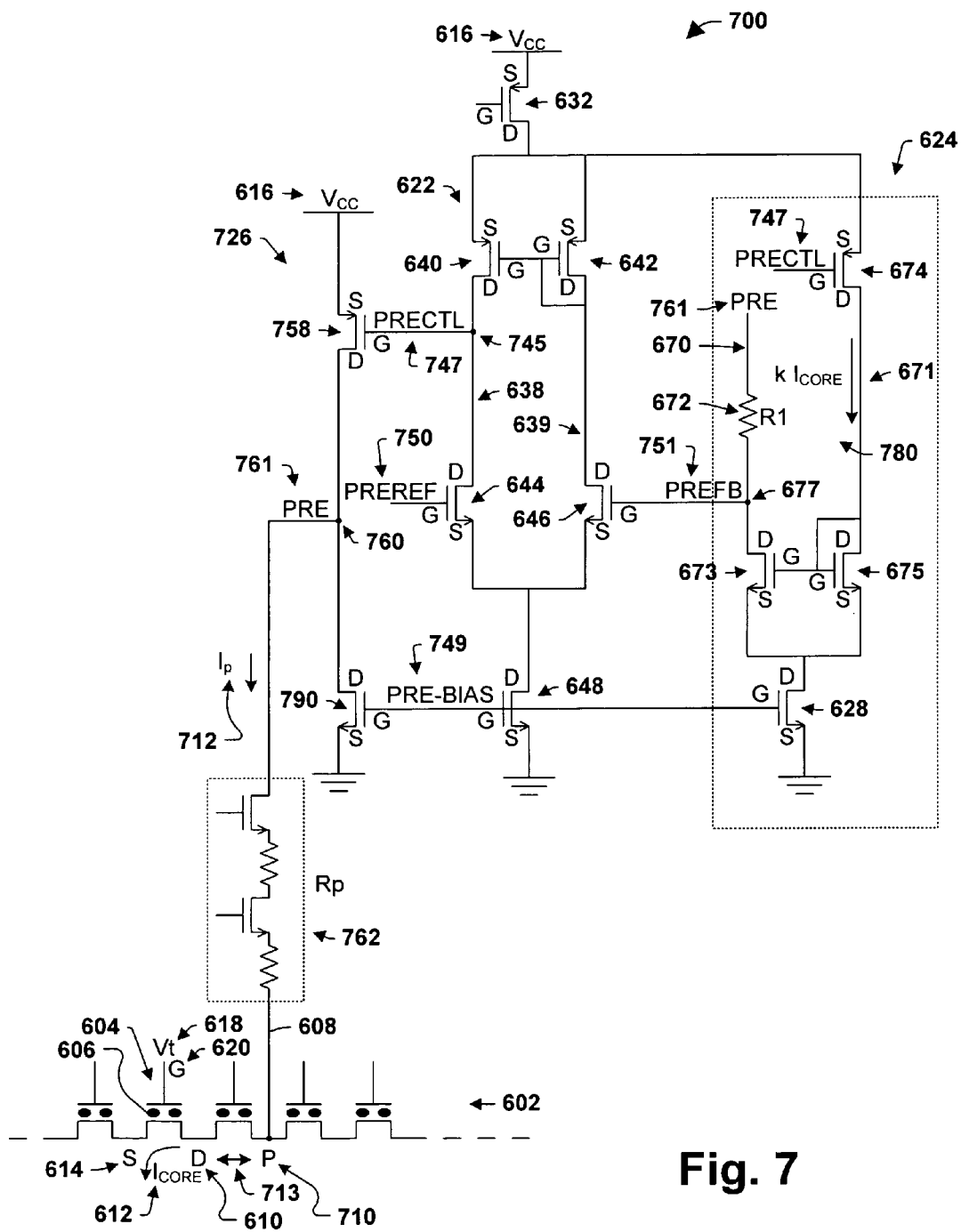
FIG. 7 is a schematic diagram illustrating an exemplary circuit according to one or more aspects of the present invention that facilitates compensating for parasitics at a protection node that mitigates leakage currents.

FIG. 7 is schematic diagram illustrating another exemplary circuit arrangement 700 similar to that presented in FIG. 6, but for regulating the voltage Vp at a protection (P) node, rather than the voltage Vd at an acting drain 610. The protection node 710 is, however, located adjacent to the drain 610 of a memory cell 604 being read to mitigate side leakage currents 713, where such leakage currents can develop between the drain 610 and this node 710 as the drain voltage Vd is increased to perform a read operation. Many of the components, elements, parts, etc. illustrated in FIG. 7 are similar to those in FIG. 6 and thus are addressed with the same reference characters. Since these similar components, elements, parts, etc. operate in a manner similar to their counterparts in FIG. 6, they are not discussed again with regard to FIG. 7 for purposes of brevity.

To mitigate side leakage currents 713 between the drain 610 and node 710, the voltage Vd at node 710 is set to a voltage potential Vp that is substantially equal to the voltage potential Vd at the drain 610. In this manner, current is not encouraged to "leak" from the drain 610 to node 710 or vice versa. Nevertheless, the voltage level Vp at this node 710 can be affected by a voltage drop across parasitics 762 in a preamplifier path 726 leading down to the protection node 710. More particularly, the voltage Vp at protection node 710 is generally equal to a preamplifier (PRE) 761 voltage level present at node 760. However, the parasitics 762 situated between node 760 and node 710 have an associated resistance Rp, and a voltage drop is developed across this resistance when a current Ip 712 flows through the preamplifier path 726. The voltage Vp at node 710 is thus equal to the PRE 713 voltage level minus the drop of Rp times Ip. It can be appreciated that a change in the voltage Vp at 710 can lead to side leakage currents 713 as the drain 610 and node 710 may have dissimilar potentials. Accordingly, the current compensating feedback component 624 serves to maintain the protection node voltage Vp at a desired level (e.g., at or about Vd) irrespective of fluctuations (both ac and dc) in Ip.

Similar to the operation of the circuit 600 in FIG. 6, a control signal PRECTL 747 that is applied to the gate (G) of a PMOS transistor 758 in the preamplifier path 726 is also applied to the gate (G) of the upper transistor 674 in the current compensating feedback component 624 in the arrangement 700 depicted in FIG. 7. In this manner, an equal current flows through transistor devices 758 and 674. A current 780 is thereby developed in the right branch 671 of the current compensating feedback component 624 that is a ratio of the current Ip 712 flowing through the preamplifier path 726. This current 780 is equal to k Ip, where k stands for the ratio, and where k is a function of the relative sizing of transistors 758 and 674. This current 780 is then mirrored over to the left branch 670 of the current compensating feedback component 624 such that a voltage level PREFB 751 at node 677 is decreased as the current k Ip 780 increases (and thus as a function of an increase in the preamplifier current Ip). PREFB 751 decreases as Ip increases since the voltage at node 677 is equal to the PRE voltage 761 applied to the second end of resistor R1 minus the drop across this resistor 672, which is equal to R1 times k Ip.

A decrease in PREFB 751 causes the level of PRECTL 747 to decrease as the differential amplifier component 622 attempts to maintain a balance in its left and right branches 638, 639. Reducing PRECTL 747 causes the PMOS device 758 in the preamplifier path 726 to turn on more since PRECTL 747 is applied to its gate (G), and the gate to source bias on that device 758 thus increases. This makes the PMOS device 758 appear as more of a short, thereby reducing the voltage drop across it, and allowing PRE 761 at node 760 to be pulled up closer to the reference voltage Vcc 616. The compensating component 624 and the differential amplifier component 622 in this arrangement 700 thus increase the REF voltage 761 at node 760 when Ip 712 increases, which compensates for the drop across the preamplifier parasitics and allows the voltage Vp at the protection node 710 to be held substantially constant (e.g., at or near the drain voltage Vd) to mitigate side leakage currents 713 between the drain 610 and the protection node 710.

Transistor 628 similarly acts as a feedback clamping device in circuit 700 by limiting the amount of current 780 that can flow in the current compensating feedback component 624, and thus the degree to which PREFB 751 and PRECTL 747 can be lowered and PRE 761 and Vp can be thereby increased. It will be appreciated that NMOS transistor 790 serves to bias the output stage of the differential amplifier component 622. It will also be appreciated that while a single protection node 710 has been discussed herein, any suitable number of such protection nodes can be located near a memory cell to mitigate leakage currents, and that respective voltages at such other protection nodes can similarly be maintained relatively constant as described herein.

Figure 8:
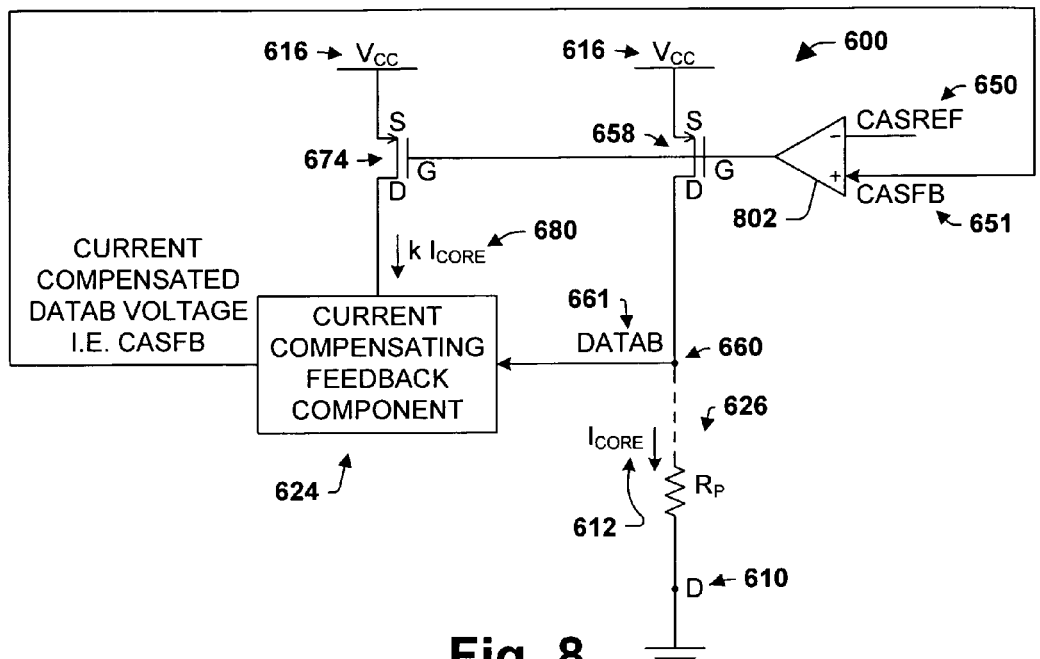
FIG. 8 is a high level block diagram illustrating an exemplary compensating circuit according to one or more aspects of the present invention having a common source type configuration.

Turning to FIG. 8, a block diagram illustrates a simplified schematic of an exemplary compensating circuit 800 according to one or more aspects of the present invention having a common source type configuration. An operational amplifier 802 is included that is configured to receive CASREF 650 and CASFB 651 signals at its negative and positive input terminals, respectively. The output of the operational amplifier 802 is coupled to the respective gates (G) of PMOS transistors 658, 674, the sources (S) of which are coupled to supply voltage Vcc 616. The drain (D) of transistor 658 is coupled to node 660 which is further coupled to a first end of a resistor Rp which models the resistance of parasitics in a bitline path 626 through which a core current Icore 612 runs. The second end of resistor Rp is coupled to the drain (D) 610 of a core memory cell (not shown). Additionally, a voltage level of DATAB 660 is provided to a current compensating feedback component 624 from node 660.

The drain (D) of transistor 674 is also coupled to the current compensating feedback component 624, and a current 680 is fed into the current compensating feedback component 624 from transistor 624. This current 680 is equal to k times Icore, where k is a ratio derived from the relative sizes of transistor 658 and 674. The current compensating feedback component samples the DATAB voltage and the current flowing through the bitline. It then uses these two pieces of information to generate a current-compensated DATAB voltage (CASFB). Accordingly, depending upon the respective levels of CASREF 650 and CASFB 651, the gate of transistor 658 is driven harder to raise the level of DATAB 660, and thus current-compensate it.

Figure 9:
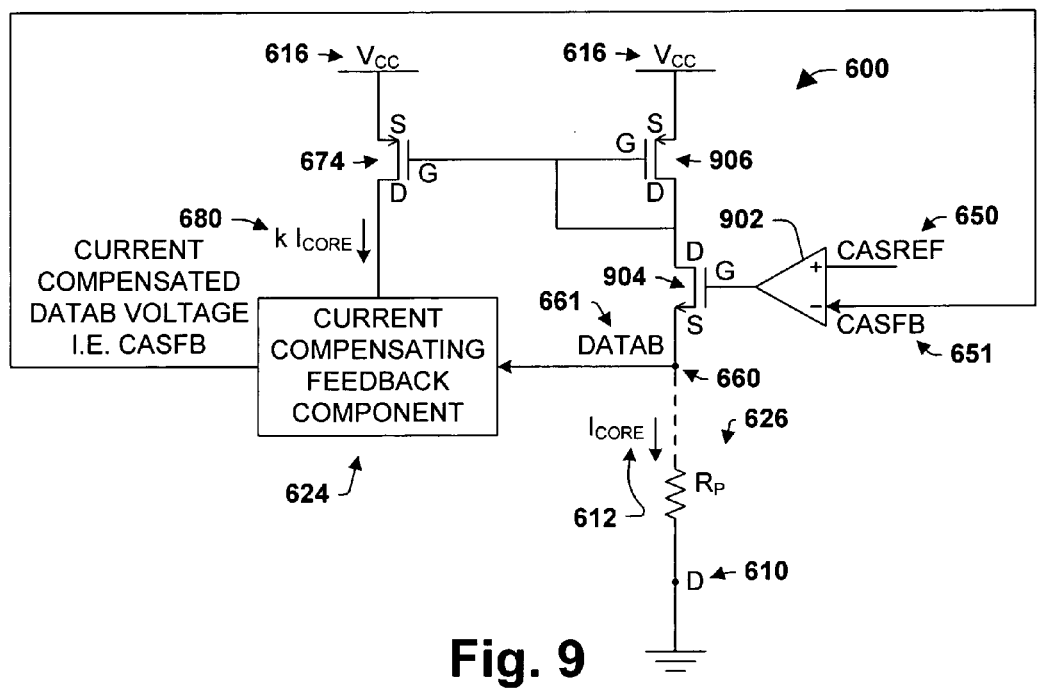
FIG. 9 is a high level block diagram illustrating an exemplary compensating circuit according to one or more aspects of the present invention having a source follower type configuration.

FIG. 9 similarly illustrates a simplified schematic of an exemplary compensating circuit 900 according to one or more aspects of the present invention, where the circuit 900 has a source follower type configuration. As in FIG. 8, an operational amplifier 902 is included that is configured to receive CASREF 650 and CASFB 651 signals. However, these signals are respectively received at the positive and negative input terminals of the operational amplifier. The output of the operational amplifier is coupled to the gate (G) of an NMOS transistor 904, the source (S) of which is coupled to node 660 and the drain (D) of which is coupled to the drain (D) of PMOS transistor 906. Node 660 is coupled to the drain (D) 610 of a core memory cell (not shown) through resistor R1, and a core current Icore 612 runs there-through.

A voltage level of DATAB 661 is fed into a current compensating feedback component 624 from node 660. The gate (G) of PMOS device 906 is coupled to the gate (G) of PMOS transistor 674, and is also connected back to the drain (D) of device 906. Respective sources (S) of transistors 906 and 674 are coupled to supply voltage Vcc 616. The drain (D) of transistor 674 is coupled to the current compensating feedback component 624 and provides a current 680 thereto, which is a ratio of the current 612 in bitline path 626. More particularly, current 689 is equal to k times Icore, where k is a ratio that is a function of the relative sizes of transistors 906 and 674. Accordingly, depending upon the values of CASREF and CASFB, the transistors 904, 906 and 674 are driven in such a manner that current k Icore 680 and voltage level DATAB 661 are provided to the current compensating feedback component 624, which produces a current compensated DATAB voltage in response thereto. It will be appreciated that while the circuits 800 and 900 of FIGS. 8 and 9, respectively, have been discussed with regard to CASREF and CASFB signals, a core current, etc., that the circuits are not to be limited thereby. For example, circuit arrangements 800 and 900 could have application to a protection node P, such as that illustrated in FIG. 7, as well as any other suitable types of circuitry.

Although the invention has been shown and described with respect to one or more implementations, equivalent alterations and modifications will occur to others skilled in the art based upon a reading and understanding of this specification and the annexed drawings. The invention includes all such modifications and alterations. With regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means an example, rather than the best.

What is claimed is:

1. A circuit configured to maintain a substantially constant voltage at a drain of a memory cell by compensating for parasitics within a bitline decoding path, the circuit comprising:
a current compensating feedback component that facilitates adjustments to the drain voltage Vd by adjusting a DATAB voltage on the bitline decoding path as a function of a current Icore flowing through the bitline decoding path, where the current flowing through the bitline decoding path results in a voltage drop across the bitline parasitics which reduces the drain voltage, and where adjusting the DATAB voltage compensates for the voltage drop across the bitline parasitics to thereby maintain the drain voltage Vd at a substantially constant level.

2. The circuit of claim 1, further comprising:
a differential amplifier component operatively coupled between the current compensating feedback component and the bitline path, the differential amplifier component receiving a CASFB voltage from the current compensating feedback component and adjusting a CASCTL voltage in response thereto, where the CASCTL voltage facilitates adjusting the DATAB voltage by regulating exposure of the bitline path to a supply voltage Vcc.

3. The circuit of claim 2, further comprising:
a bitline transistor in the bitline path that is driven by the adjusted CASCTL voltage which allows the exposure of the bitline path to the supply voltage Vcc to be selectively regulated.

4. The circuit of claim 3, wherein the CASFB voltage output by the current compensating feedback component is equal to the DATAB voltage reduced by a factor that is a function of the core current Icore.

5. The circuit of claim 4, wherein the current compensating feedback component comprises:
a left branch including an upper resistor R1 and a lower transistor; and
a right branch including an upper transistor and a lower transistor,
where the CASCTL voltage is applied to the upper transistor to establish a current k Icore within the right branch that is a ratio of the current Icore flowing in the bitline path, where the ratio k is a function of the relative sizes of the upper transistor and the bitline transistor,
where the lower transistors are configured to mirror the current in the right branch over to the left branch, and
where a first end of resistor R1 is coupled to a node wherein the CASFB voltage is output from the current compensating feedback component, and a second end of resistor R1 has the DATAB voltage applied thereto so that the CASFB voltage is equal to the DATAB voltage minus the drop across resistor R1, where the drop across R1 is equal to k Icore times R1.

6. The circuit of claim 5, further comprising:
a feedback clamping device operatively coupled to the current compensating feedback component to limit the amount of compensation that the current compensating feedback component can provide.

7. The circuit of claim 6, wherein the feedback clamping device comprises:
a transistor operatively coupled to the left and right branches of the current compensating feedback component to limit the current that can flow through these branches and thus the voltage drop that occurs across resistor R1 and thus the degree to which the CASFB voltage is reduced.

8. The circuit of claim 7, wherein the differential amplifier component comprises:
a left branch having a first upper transistor and a first lower transistor in series with one another; and
a right branch having a second upper transistor and a second lower transistor in series with one another,
where the first upper transistor and the second upper transistor are in parallel with one another and the first lower transistor and the second lower transistor are in parallel with one another,
where the CASFB voltage from the current compensating feedback component is received at the second lower transistor, and
where the adjusted CASCTL voltage is output to the bitline transistor from a node of the differential amplifier component located between the first upper transistor and the first lower transistor.

9. The circuit of claim 8, further comprising:
an output stage operatively coupled to the bitline path, and off of which a voltage SAIN can be tapped which is indicative of the current flowing through the bitline path and thus through the memory cell, which can be used to determine a bit level stored within the memory cell.

10. The circuit of claim 9, wherein at least one of:
the preamplifier transistor comprises a PMOS transistor,
the first and second upper transistors of the differential amplifier component comprise respective PMOS transistors,
the first and second lower transistors of the differential amplifier component comprise respective NMOS transistors,
the lower transistor in the left branch of the current compensating feedback component comprises an NMOS transistor,
the upper transistor in the right branch of the current compensating feedback component comprises a PMOS transistor,
the lower transistor in the right branch of the current compensating feedback component comprises an NMOS transistor,
the transistor of the feedback clamping device comprises an NMOS transistor, and
the value of R1 is based upon a desired compensation potential Vcomp and a current multiplication factor k.

* * * * *